United States Patent
Deepak et al.

(10) Patent No.: US 7,194,705 B1
(45) Date of Patent: Mar. 20, 2007

(54) SIMULATION OF INTEGRATED CIRCUITRY WITHIN A HIGH-LEVEL MODELING SYSTEM USING HARDWARE DESCRIPTION LANGUAGE CIRCUIT DESCRIPTIONS

(75) Inventors: Kumar Deepak, San Jose, CA (US); L. James Hwang, Menlo Park, CA (US); Singh Vinay Jitendra, Fremont, CA (US); Haibing Ma, Superior, CO (US); Roger B. Milne, Boulder, CO (US); Nabeel Shirazi, San Jose, CA (US); Jeffrey D. Stroomer, Lafayette, CO (US); Jimmy Zhenming Wang, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 663 days.

(21) Appl. No.: 10/388,692

(22) Filed: Mar. 14, 2003

(51) Int. Cl.
*G06F 17/50* (2006.01)

(52) U.S. Cl. ............ 716/3; 716/5; 716/18; 716/7; 703/16

(58) Field of Classification Search ............ 716/3, 716/5, 18, 7; 703/16
See application file for complete search history.

(56) References Cited

U.S. PATENT DOCUMENTS

| | | | | |
|---|---|---|---|---|
| 5,111,413 | A * | 5/1992 | Lazansky et al. ............ | 703/14 |
| 5,437,037 | A * | 7/1995 | Furuichi ............ | 717/146 |
| 5,603,015 | A * | 2/1997 | Kurosawa et al. ............ | 703/15 |
| 5,903,475 | A * | 5/1999 | Gupte et al. ............ | 703/16 |
| 5,946,472 | A * | 8/1999 | Graves et al. ............ | 703/6 |
| 6,053,947 | A * | 4/2000 | Parson ............ | 703/14 |
| 6,099,577 | A * | 8/2000 | Isobe ............ | 716/2 |
| 6,152,612 | A * | 11/2000 | Liao et al. ............ | 703/23 |
| 6,175,946 | B1 * | 1/2001 | Ly et al. ............ | 716/4 |
| 6,233,540 | B1 * | 5/2001 | Schaumont et al. ............ | 703/14 |
| 6,360,192 | B2 * | 3/2002 | Dearth et al. ............ | 703/15 |
| 6,421,634 | B1 * | 7/2002 | Dearth et al. ............ | 703/14 |

(Continued)

FOREIGN PATENT DOCUMENTS

EP 490478 A2 * 6/1992

(Continued)

OTHER PUBLICATIONS

Pandey et al., "VHDL Semantics and Validating Transformations", IEEE Transactions on Computer-Aided Design of Integrated Circuits and Systems, vol. 18, No. 7, Jul. 1999, pp. 936-955.*

(Continued)

*Primary Examiner*—Phallaka Kik
(74) *Attorney, Agent, or Firm*—W. Eric Webostad (57) ABSTRACT

Method, apparatus, and computer readable medium for simulating an integrated circuit within a modeling system using one or more circuit description language representations of circuitry is described. By example, a circuit description language representation of the one or more circuit description language representations of circuitry is translated into a program language circuit description. A first simulation process is executed and input data is obtained therefrom. A second simulation process is executed with the input data as parametric input to produce output data, the second simulation process being derived from the program language circuit description. The output data produce by the second simulation process is provided to the first simulation process.

23 Claims, 5 Drawing Sheets

U.S. PATENT DOCUMENTS

| | | | | |
|---|---|---|---|---|
| 6,470,478 | B1* | 10/2002 | Bargh et al. | 716/4 |
| 6,571,373 | B1* | 5/2003 | Devins et al. | 716/5 |
| 6,587,995 | B1* | 7/2003 | Duboc et al. | 716/4 |
| 6,606,588 | B1* | 8/2003 | Schaumont et al. | 703/15 |
| 6,606,734 | B2* | 8/2003 | Greaves | 716/4 |
| 6,691,301 | B2* | 2/2004 | Bowen | 717/114 |
| 6,701,501 | B2* | 3/2004 | Waters et al. | 716/8 |
| 6,701,515 | B1* | 3/2004 | Wilson et al. | 717/117 |
| 6,704,891 | B2* | 3/2004 | Woo et al. | 714/718 |
| 6,816,828 | B1* | 11/2004 | Ikegami | 703/15 |
| 6,978,231 | B2* | 12/2005 | Williams et al. | 703/14 |
| 6,993,469 | B1* | 1/2006 | Bortfeld | 703/15 |
| 6,996,799 | B1* | 2/2006 | Cismas et al. | 717/106 |
| 7,006,960 | B2* | 2/2006 | Schaumont et al. | 703/15 |
| 7,007,249 | B2* | 2/2006 | Ly et al. | 716/4 |
| 7,035,781 | B1* | 4/2006 | Flake et al. | 703/14 |
| 7,036,106 | B1* | 4/2006 | Wang et al. | 716/18 |
| 7,062,728 | B2* | 6/2006 | Tojima | 716/3 |
| 7,146,300 | B2* | 12/2006 | Zammit et al. | 703/13 |
| 2001/0041972 | A1* | 11/2001 | Dearth et al. | 703/14 |
| 2002/0049576 | A1* | 4/2002 | Meyer | 703/14 |
| 2002/0108094 | A1* | 8/2002 | Scurry | 716/5 |
| 2002/0133788 | A1* | 9/2002 | Waters et al. | 716/3 |
| 2002/0138244 | A1* | 9/2002 | Meyer | 703/14 |
| 2002/0188910 | A1* | 12/2002 | Zizzo | 716/1 |
| 2003/0005392 | A1* | 1/2003 | Tojima | 716/2 |
| 2003/0018461 | A1* | 1/2003 | Beer et al. | 703/14 |
| 2003/0061580 | A1* | 3/2003 | Greaves | 716/4 |
| 2003/0233219 | A1* | 12/2003 | Landers et al. | 703/14 |
| 2003/0237062 | A1* | 12/2003 | Whitehill | 716/4 |
| 2004/0143362 | A1* | 7/2004 | Matthews et al. | 700/182 |
| 2004/0143801 | A1* | 7/2004 | Walters et al. | 716/3 |
| 2005/0223191 | A1* | 10/2005 | Ferris | 712/28 |
| 2006/0053404 | A1* | 3/2006 | Allen et al. | 716/16 |
| 2006/0190907 | A1* | 8/2006 | Allen et al. | 716/18 |
| 2006/0259878 | A1* | 11/2006 | Killian et al. | 716/1 |

FOREIGN PATENT DOCUMENTS

| | | | |
|---|---|---|---|
| EP | 560342 A1 | * | 9/1993 |
| JP | 10260997 A | * | 9/1998 |
| JP | 2003015910 A | * | 1/2003 |

OTHER PUBLICATIONS

Krishnaswamy et al., "A Procedure for Software Synthesis from VHDL Models", Proceedings of the ASP-DAC '97 Asia and South Pacific Design and Automation Conference, Jan. 28, 1997, pp. 593-598.*

Tan et al., "A Fast Signature Simulating Tool for Built-In-Self-Testing Circuits", 24th Conference on Design Automation, May 28, 1987, pp. 17-25.*

* cited by examiner

SIMULATION OF INTEGRATED CIRCUITRY WITHIN A HIGH-LEVEL MODELING SYSTEM USING HARDWARE DESCRIPTION LANGUAGE CIRCUIT DESCRIPTIONS

FIELD OF THE INVENTION

One or more aspects of the invention relate generally to electronic integrated circuit design and, more particularly, to simulation of integrated circuitry within a high-level modeling system using hardware description language (HDL) circuit descriptions.

BACKGROUND OF THE INVENTION

Hardware Description Languages (HDLs), such as the Very high-speed integrated circuit Hardware Description Language (VHDL) or Verilog are text-based approaches to digital logic design through behavioral and/or structural description of design elements. HDL can be used to design: (1) a programmable logic device (PLD), such as a field programmable gate array (FPGA) or complex programmable logic device (CPLD); (2) a mask programmable device, such as a hardwired programmable gate array (PGA), application-specific standard product (ASSP) or application specific integrated circuit (ASIC); (3) a system formed from selected electronic hardware components; or (4) any other electronic device. The HDL-based design methodology requires the user to describe the behavior of a system, which can then be simulated to determine whether the design will function as desired. The design is then synthesized to create a logical network list ("netlist") that can be implemented within a particular device.

As the complexity of design is rapidly increasing, a higher level of abstraction than a HDL is becoming more popular to design ICs. An example is a high level modeling system (HLMS). A HLMS is a software tool in which electronic designs can be described, simulated, and translated by machine into a design realization. An HLMS generally provides a mathematical representation of signals as compared to standard logic vectors in a HDL. The Xilinx System Generator tool for DSP is an example HLMS that runs within the MathWorks' Simulink and MATLAB environments.

In some instances, an HLMS is used to design and simulate integrated circuitry, where some circuit elements are described using HDL. For example, HDLs provide special constructs for designing ICs, including semantics for concurrency, reactivity, hardware style communication, and the like. As such, many ICs are designed using HDL, resulting in readily available HDL descriptions of circuit elements.

Typically, an IC design produced by an HLMS is implemented using a software program language, such as C, C++, or Java. IC designs inside the HLMS are constructed from software objects that are available in the language used to implement the HLMS. Software program languages differ from HDL in many respects, including syntax, semantics, data types, and system interface. As such, HDL descriptions of circuit elements cannot be used directly with the software program language environment of an HLMS, or the program language description of an IC produced by an HLMS.

Consequently, an HDL co-simulation process is conventionally employed when incorporating HDL descriptions of circuit elements within an IC design implemented using an HLMS. HDL co-simulation is a process whereby HDL descriptions of circuit elements are simulated using a separate stand-alone HDL simulator. The simulation results are forwarded to the HLMS using inter-process communication between the HLMS and the stand-alone HDL simulator. Such inter-process communication between two individual circuit design tools may be onerous. For example, HDL co-simulation requires the compilation of the HDL description every time the IC design is simulated within the HLMS. Furthermore, it is difficult to optimize an IC design produced by an HLMS when portions of the IC design are simulated using a stand-alone HDL simulator.

Therefore, there exists a need in the art for simulation of integrated circuitry within a high-level modeling system using HDL circuit descriptions without employing HDL co-simulation or other mechanisms requiring inter-process communication.

SUMMARY OF THE INVENTION

Method, apparatus, and computer readable medium for simulating an integrated circuit within a modeling system using one or more circuit description language representations of circuitry is described. In an embodiment, a circuit description language representation of the one or more circuit description language representations of circuitry is translated into a program language circuit description. A first part of a simulation is executed and input data is obtained therefrom. A second part of the simulation is executed with the input data as parametric input to produce output data, the part of the simulation being associated with the program language circuit description. For example, the program language circuit description may be written using a compiled program language, where the second part of simulation executes compiled object code. Alternatively, the program language circuit description may be written using an interpreted program language, where the second part of the simulation uses an interpreter.

In another embodiment, a high level modeling system (HLMS), comprising a plurality of HLMS components, includes a method of simulating an integrated circuit design having a hardware description language (HDL) representation of a circuit. The method includes: first, translating the HDL representation into a first HLMS component. Next a first part of a simulation process associated with a second HLMS component is executed and input data is obtained. And lastly, a second part of the simulation process with the input data as parametric input is executed in order to produce output data, where the second part of the simulation process is associated with the first HLMS component.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method, apparatus, and computer readable medium for simulating integrated circuitry within an integrated circuit (IC) modeling system using hardware description language (HDL) circuit descriptions is described. One or more aspects of the invention are related to using HDL circuit descriptions within a software program language environment of a high-level modeling system (HLMS). Those skilled in the art, however, will appreciate that the invention may be employed within other types of modeling systems that facilitate the design of ICs. For example, modeling systems that may be used include schematic editors that write a design as HDL, or text-based design tools that allow users to assemble a design from a library of fixed HDL blocks, as well as HDL templates.

Figure 1:
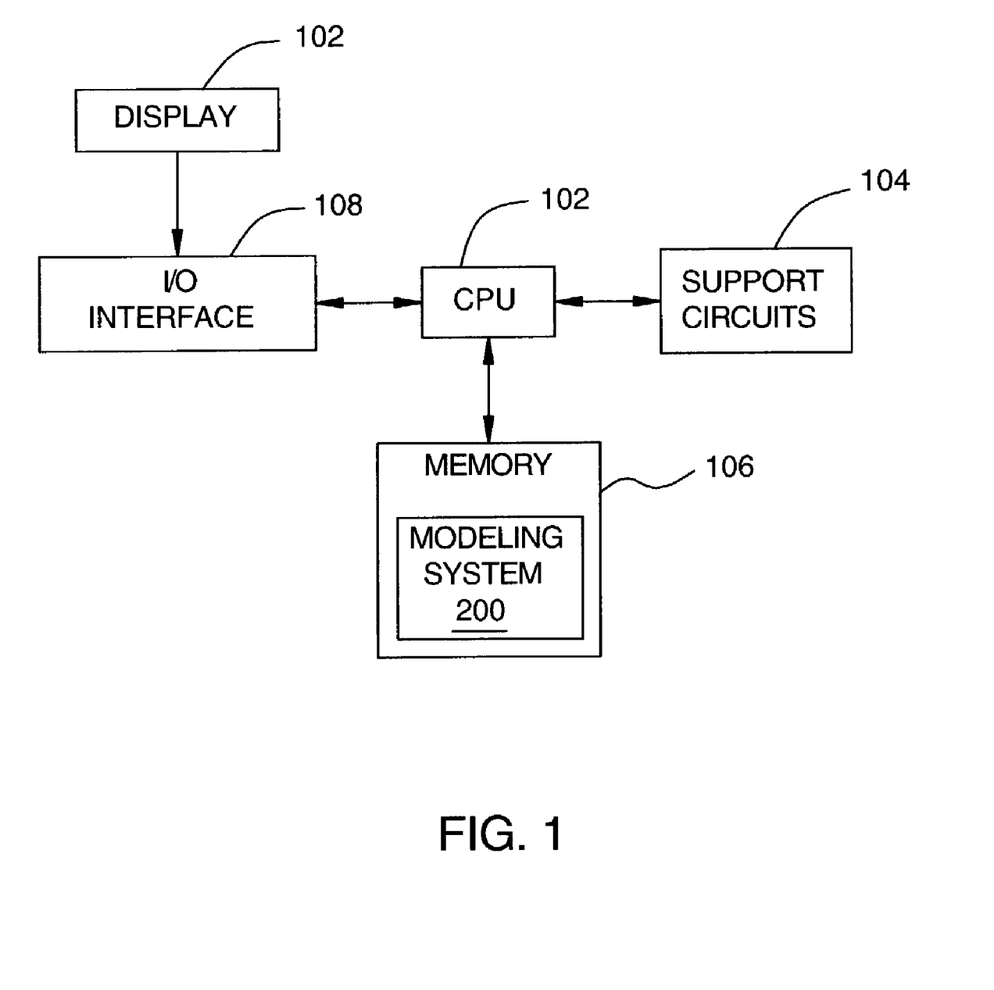
FIG. 1 depicts a block diagram showing an exemplary embodiment of a computer system suitable for implementing processes and methods in accordance with one or more aspects of the invention.

FIG. 1 depicts a block diagram showing an exemplary embodiment of a computer system 100 suitable for implementing processes and methods in accordance with one or more aspects of the invention. Computer system 100 includes a central processing unit (CPU) 102, memory 106, a variety of support circuits 104, and an I/O interface 108. CPU 102 may be any type of microprocessor known in the art. Support circuits 104 for CPU 102 include conventional cache, power supplies, clock circuits, data registers, I/O interfaces, and the like. I/O interface 108 may be directly coupled to memory 106 or coupled through CPU 102, and may be coupled to a conventional keyboard, network, mouse, printer, and interface circuitry adapted to receive and transmit data, such as data files and the like. I/O interface 108 may be coupled to a display 112.

Memory 106 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 100 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 106. Memory 106 may include one or more of the following random access memory, read only memory, magneto-resistive read/write memory, optical read/write memory, cache memory, magnetic read/write memory, and the like, as well as signal-bearing media as described below. Memory 106 may store all or a portion of integrated circuit modeling system 200 of FIG. 2.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 2:
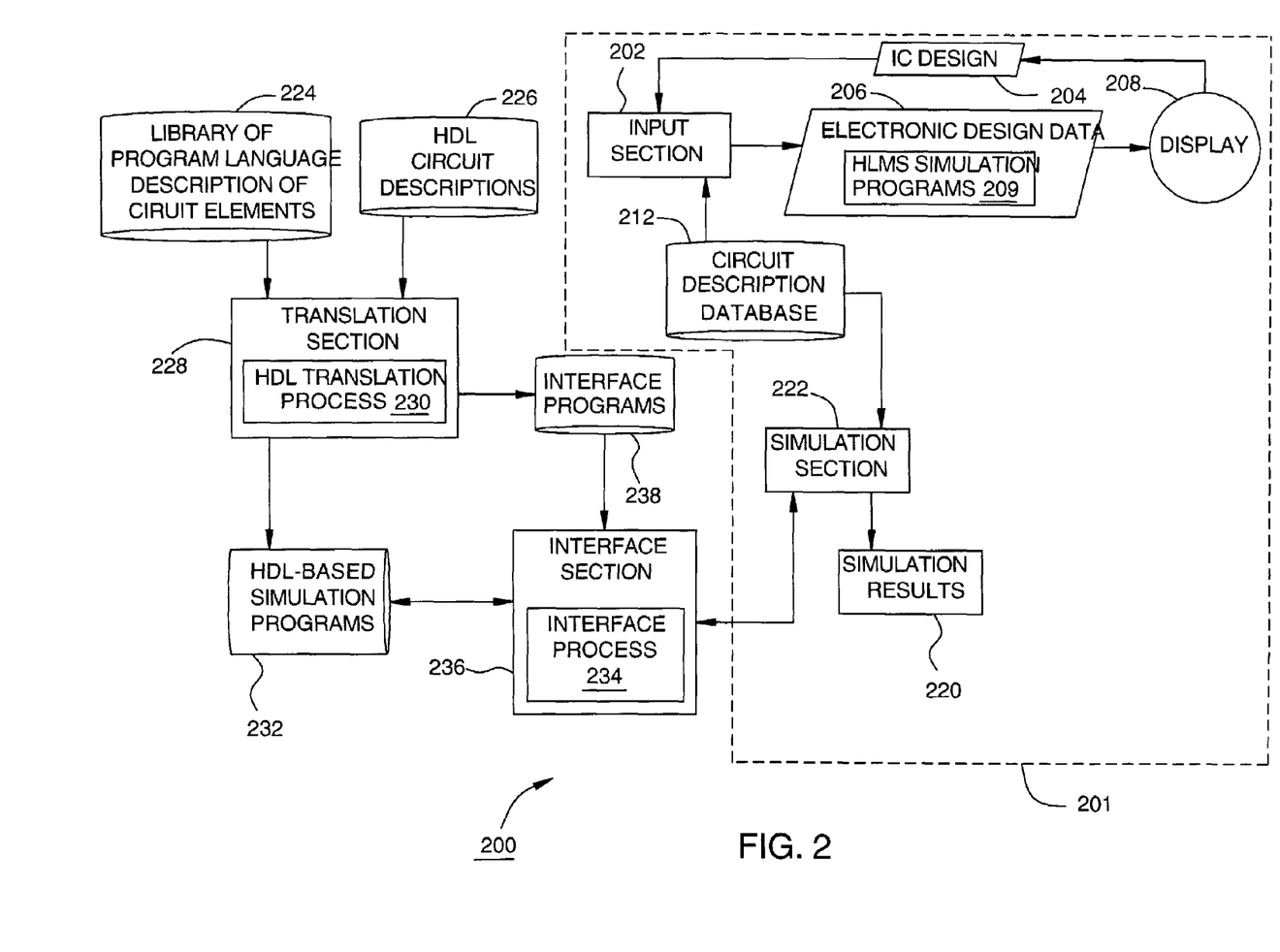
FIG. 2 depicts a high-level block diagram showing an exemplary embodiment of integrated circuit modeling system in accordance with one or more aspects of the invention.

FIG. 2 depicts a high-level block diagram showing an exemplary embodiment of an integrated circuit modeling system 200 in accordance with one or more aspects of the invention. Modeling system 200 includes an HLMS 201, a translation section 228, and an interface section 236. HLMS 201 includes an input section 202, a display 208, and a simulation section 222. In an embodiment, modeling system 200 is implemented using computer system 100 of FIG. 1. Notably, translation section 228, interface section 236, and HLMS 201 may be all or portions of one or more programs stored within memory 106 and executed by CPU 102.

IC design 204 is input, such as at a schematic or a textual description, to HLMS 201 using input section 202 and display 208. Input section 202 produces electronic design data 206 that includes an electronic representation of IC design 204 having a plurality of abstractions or circuit descriptions. The circuit descriptions represent the behavior of circuit components or elements of IC design 204. Circuit descriptions for various circuit components or elements may be stored in circuit description database 212. Electronic design data 206 may be schematically represented on display 208.

For example, System Generator for DSP, commercially available from Xilinx, Inc., is an HLMS that produces an electronic representation of an IC design that includes "blocks", "ports", and "nets". Blocks, or logic blocks, represent sections, having components, of IC design 204. Ports represent inputs and outputs of blocks, and nets, or networks, represent connections between various ports of various blocks. As understood by those skilled in the art, integrate circuit modeling systems may employ other types of circuit descriptions to represent an IC design in addition to, or in place of, the above-described blocks, ports, and nets.

Electronic design data 206 also includes one or more programs for simulating IC design 204 ("HLMS simulation programs" 209). HLMS simulation programs 209 include program-language circuit descriptions corresponding to IC design 204. HLMS simulation programs 209 may be written using an interpreted program language, such as Python, or a compiled program language, such as C, C++, Java, objective-C, or like type program interpreted or compiled program languages known in the art. Though other program languages may be used, for purposes of exposition, HLMS simulation programs 209 are described as being written using C++.

Some of the program language circuit descriptions corresponding to IC design 204 may be stored within HLMS

201. For example, a multiplexer block may be stored within circuit description database 212. As described in more detail below, other of the program language circuit descriptions of IC design 204 may be stored external to HLMS 201, notably, within a library of simulation programs based on HDL circuit descriptions ("HDL-based simulation programs" 232). For example, simulation programs for implementing an FIR filter block or a Viterbi decoder block may be stored as HDL-based simulation programs 232.

Electronic design data 206 may also be coupled to simulation section 222. Simulation section 222 executes one or more of HLMS simulation programs 209, which produce simulation results 220. As described above, some portions of HLMS simulation programs 209 may be stored external to HLMS 201 as HDL-based simulation programs 232. HDL-based simulation programs 232 include program language versions of HDL circuit descriptions. In an embodiment, HDL circuit descriptions 226 are translated into a compiled language, such as C++. The C++ circuit descriptions are compiled and linked in a well-known manner into executable object code. The object code is stored as HDL-based simulation programs 232. For example, HDL-based simulation programs 232 may be dynamic link libraries (DLLs) that are dynamically linked with HLMS simulation programs 209 during simulation in simulation section 222. In another example, HDL-based simulation programs 232 are static libraries that can be linked with HLMS simulation programs 209 when such programs are compiled. In another embodiment, HDL circuit descriptions 226 are translated into an interpreted language, such as Python. In such embodiment, the HDL-based simulation programs 232 are program code to be executed by a Python interpreter. In an exemplary embodiment, HDL-based simulation programs 232 are executed as part of a single process within the HLMS 201, for example, the UNIX kernel process. Thus, this embodiment does not require inter-process communication between HLMS simulation programs 209 and HDL-based simulation programs 232. In an alternative embodiment a HDL simulation program is executed as part of first process within the HLMS and an HLMS program executed as part of a second process within the HLMS, where, optionally, the first process executes concurrently with the second process.

By translating HDL circuit descriptions 226 into program language circuit descriptions, use of a HDL circuit description as a block within HLMS 201 is facilitated. In an HLMS, the input and output ports of a circuit description, such as a block, define the boundary of a high-level simulation. If a designer desires a more detailed description of a block, the designer may employ constructs provided by HDL to specify semantics. Such HDL constructs include those that specify concurrency, reactivity, hardware style communication, and like type semantics known in the art.

Notably, one or more HDL circuit descriptions 226 are stored within a library. HDL circuit descriptions 226 are coupled to translation section 228. Translation section 228 executes HDL translation process 230 to translate or "compile" HDL circuit descriptions 226 into program language circuit descriptions, from which HDL-based simulation programs 232 are derived by compilation or interpretation, as described above. Translation section 228 utilizes pre-defined program language circuit descriptions stored within program language library 224. For example, library 224 may include a C++ class library for implementing circuit components or elements. HDL translation process 230 is described in more detail below.

Translation section 228 may also execute HDL translation process 230 to produce programs that provide an interface between HLMS 201 and simulation program library 232 ("interface programs" 238). Interface programs 238 may be stored within a library. In an embodiment, translation section 228 produces one of interface programs 238 for each of HDL-based simulation programs 232 that are produced. Interface programs 238 are coupled to interface section 236. Interface section 236 executes interface process 234 in response to requests from simulation section 222 of HLMS 201. Interface process 234 is described in more detail below.

Figure 3:
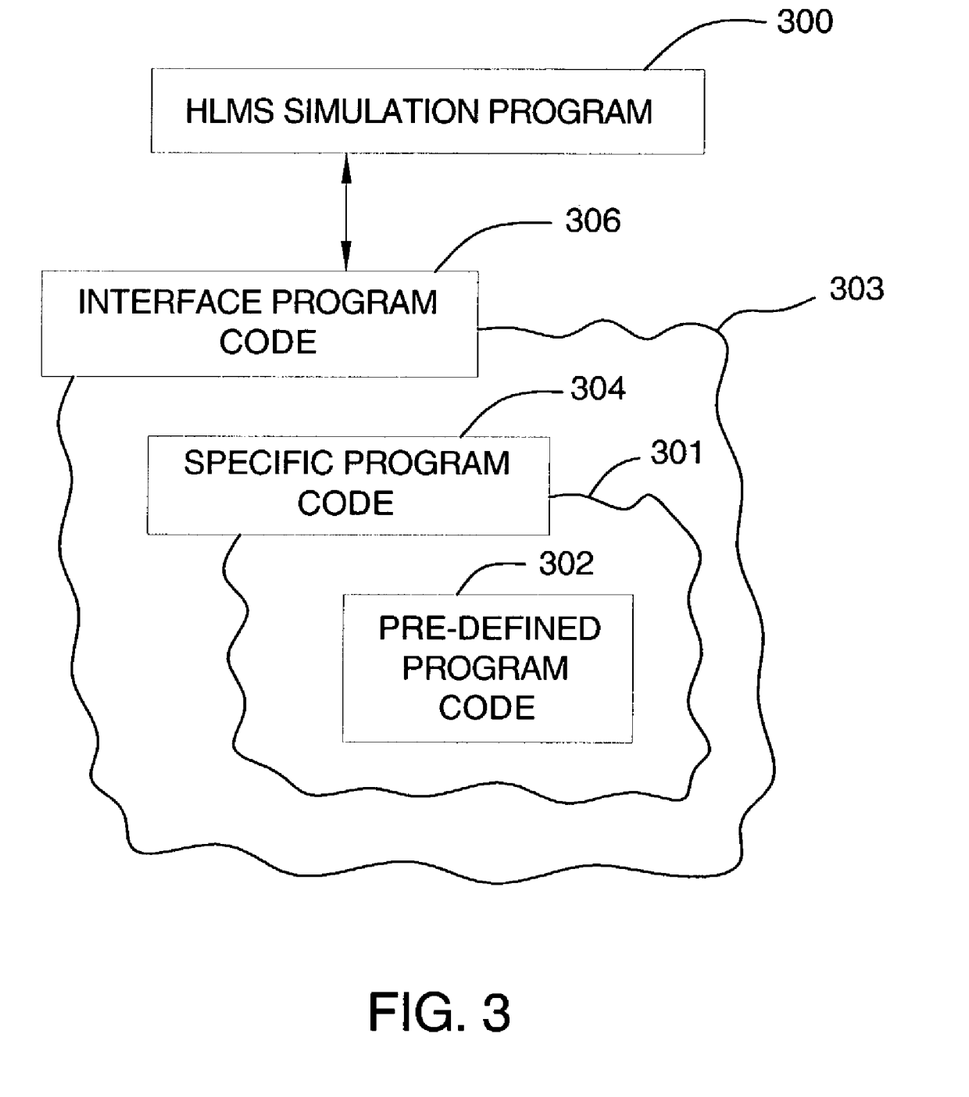
FIG. 3 depicts a block diagram showing an exemplary embodiment of a high-level modeling system simulation program interfacing a program language version of an HDL circuit description in accordance with one or more aspects of the invention.

FIG. 3 depicts a block diagram showing an exemplary embodiment of an HLMS simulation program 300 interfacing a simulation program corresponding to an HDL circuit description ("HDL-based simulation program" 301) in accordance with one or more aspects of the invention. HLMS simulation program 300 may be one of HLMS simulation programs 209 within HLMS 201. HDL-based simulation program 301 may be one of HDL-based simulation programs 232. HDL-based simulation program 301 includes program code corresponding to pre-defined program language circuit descriptions ("pre-defined program code" 302). Pre-defined program code 302 may be stored within library 224. For example, pre-defined program code 302 may be C++ classes that may be used as base classes for implementing circuit components or elements of an IC design.

HDL-based simulation program 301 also includes program code specific to the associated HDL circuit description ("specific program code" 304). Specific program code 304 interfaces or "wraps" pre-defined program code 302. For example, specific program code 304 may be C++ classes derived from the C++ classes within pre-defined program code 302. The derived C++ classes include information that specifically pertains to the associated HDL circuit description, such as the types of input and output ports, and like type attributes. Notably, if the associated HDL circuit description accepts parametric input, specific program code 304 may be used to facilitate such parametric input. The derived C++ classes may be used to instantiate data objects representing circuit components or elements of an IC design.

An interface program 303 provides an interface between HLMS simulation program 300 and HDL-based simulation program 301. Interface program 303 may be one of interface programs 238. Interface program 303 includes interface program code 306 for wrapping HDL-based simulation program 301 to provide an interface to such HDL-based simulation program 301. For example, interface program code 306 may be C++ program code that translates port and data types between HLMS simulation program 300 and HDL-based simulation program 301. The HDL and HLMS representations of a component may differ in terms of their ports. Interface program code 306 may indicate which ports within HDL-based simulation program 301 correspond with the appropriate ports within HLMS simulation program 300. In addition, HDL data types may be different from HLMS data types. Interface program code 306 may also direct the mapping between HDL data types and HLMS data types. Those skilled in the art will appreciate that HLMS simulation program 300 may interface with multiple HDL-based simulation programs 301.

Figure 4:
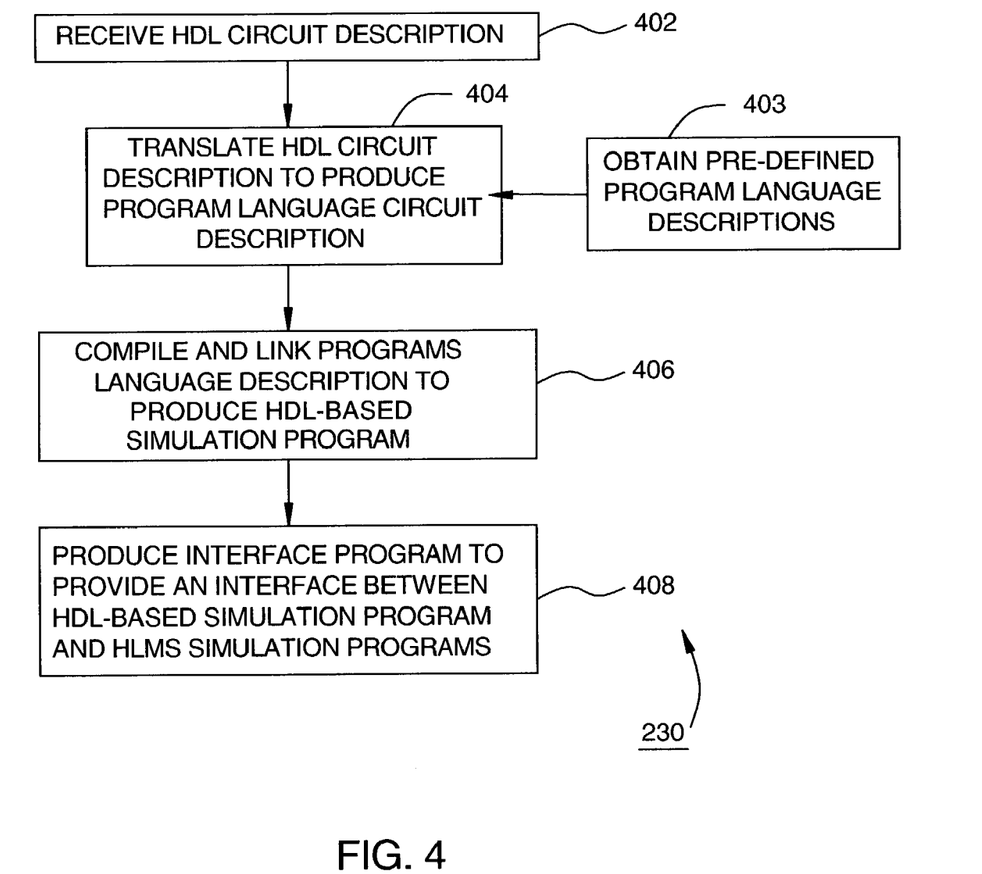
FIG. 4 depicts a flow diagram showing an exemplary embodiment of a process for translating HDL circuit descriptions into program language circuit descriptions in accordance with one or more aspects of the invention.

FIG. 4 depicts a flow diagram showing an exemplary embodiment of HDL translation process 230 in accordance with one or more aspects of the invention. Process 230 may be understood with simultaneous reference to FIG. 2. In an embodiment, process 230 is implemented using computer system 100 of FIG. 1. Notably, all or portions of one or more programs of process 230 may be stored within memory 106 and executed by CPU 102.

Process 230 begins at step 402, where an HDL circuit description is obtained from library 226. At step 404, the HDL circuit description from step 402 is translated or compiled in translation section 228 to produce a program language circuit description. The program language circuit description is produced in part using pre-defined program language descriptions from database 224 obtained at step 403. In an embodiment, translation section 228 compiles the HDL circuit description by parsing the HDL circuit description to identify HDL constructs, and translating the HDL constructs into corresponding constructs of a program language, such as C++. Translation section 228 may support a significant number of HDL constructs to facilitate designer freedom for producing IC design 204. HDL circuit descriptions, however, may include a high level of detail. Since the input and output ports are the boundaries of HLMS 201, translation section 224 may be used to optimize the resulting program language circuit description to increase the performance of the simulation.

At step 406, an HDL-based simulation program is produced by compiling and linking the program language circuit description produced at step 404. In an alternative embodiment, the program language circuit description produced at step 404 is an interpreted language. In such embodiment, the program language circuit description is directly stored, namely, without having to do any additional conversion, as the HDL-based simulation program.

At step 408, an interface program is produced to provide an interface between HLMS simulation programs 209 and the HDL-based simulation programs within simulation program library 232. The interface program may pass information from HLMS simulation programs 209 to HDL-based simulation programs, trigger the execution of the HDL-based simulation programs, and pass information from the HDL-based simulation programs to HLMS simulation programs 209. As described above, the interface program converts the data types accordingly when passing information between HLMS simulation programs 209 and HDL-based simulation programs. Because the number of ports and the types of ports are clearly specified in the HDL circuit description, the interface program may be generated based on the HDL circuit description. In an embodiment, the interface program may be produced using only the portion of the HDL circuit description specifying the bit and cycle simulation boundaries, whereby the entire HDL circuit description is not analyzed to produce the interface program.

Figure 5:
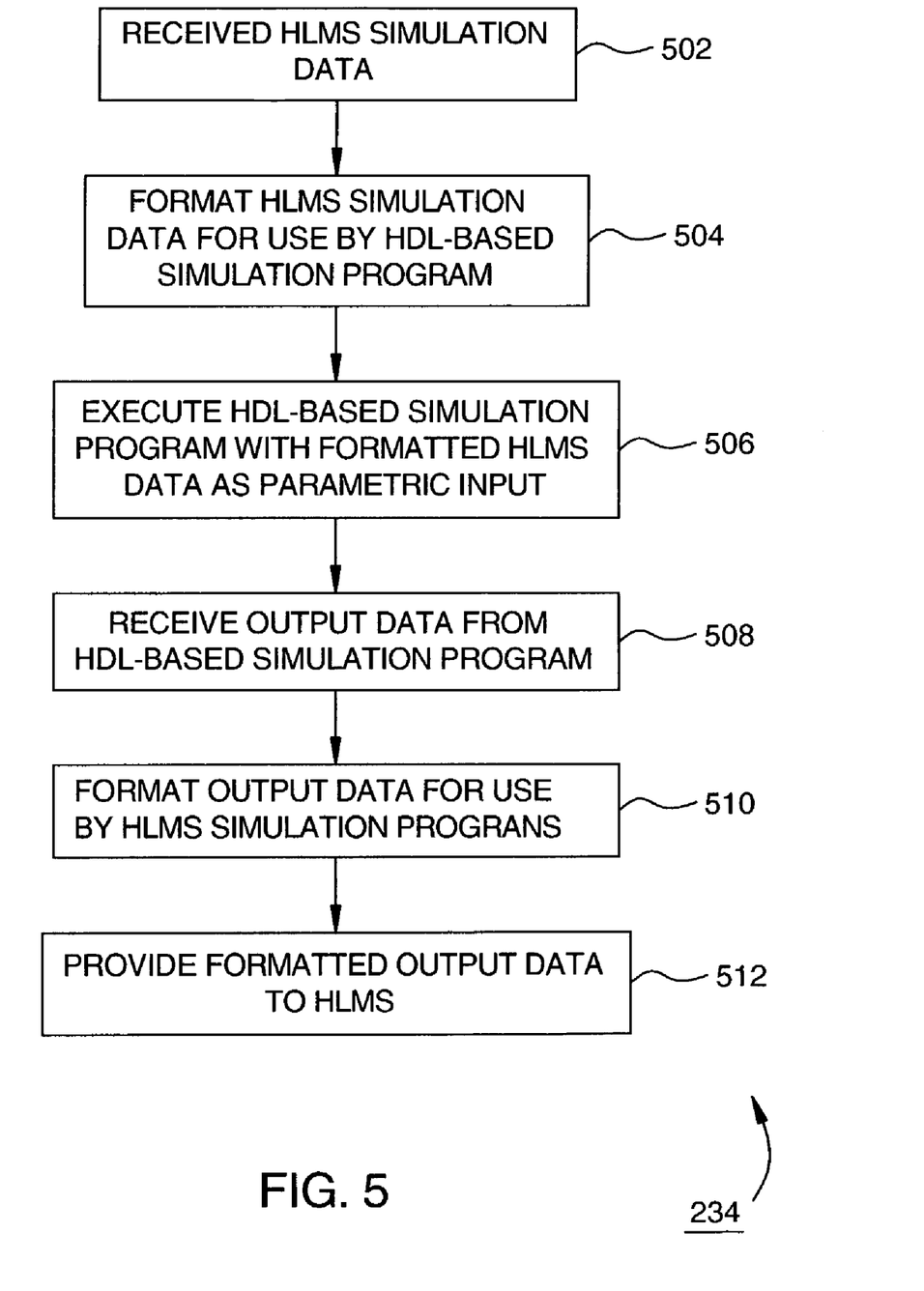
FIG. 5 depicts a flow diagram showing an exemplary embodiment of a process for interfacing translated HDL circuit descriptions generated by the process of FIG. 4 with simulation programs implemented within a high-level modeling system in accordance with one or more aspects of the invention.

FIG. 5 depicts a flow diagram showing an exemplary embodiment of interface process 234 in accordance with one or more aspects of the invention. Interface process 234 may be understood with simultaneous reference to FIG. 2. In an embodiment, process 234 is implemented using computer system 100 of FIG. 1. Notably, all or portions of one or more programs of process 234 may be stored within memory 106 and executed by CPU 102.

Process 234 begins at step 502, where HLMS simulation data is obtained from simulation section 222. The HLMS simulation data is produced by HLMS simulation programs 209. At step 504, the HLMS simulation data obtained at step 502 is formatted for use with an HDL-based simulation program within the simulation program library 232. Such formatting includes, for example, data and port type translation as described above. At step 506, the HDL-based simulation program is executed by simulation section 222 with the formatted HLMS simulation data from step 504 as parametric input.

At step 508, output data is obtained from the HDL-based simulation program. At step 510, the output data obtained at step 508 is formatted for use with HLMS simulation programs 209. At step 512, the formatted output data from step 510 is provided to HLMS 201, notably, simulation section 222.

Method, apparatus, and computer readable medium for using HDL descriptions of circuit elements within an IC design implemented using an IC modeling system has been described. The invention provides a mechanism by which HDL circuit descriptions may be used within an HLMS to produce an IC design. By translating HDL circuit descriptions into program language circuit descriptions and implementing such program language circuit descriptions as a library, the need for a stand-alone HDL simulator and the use of inter-process communication associated with conventional HDL co-simulation processes is avoided or reduced. In addition, by linking HLMS simulation programs with the HDL-based library, the need to re-compile HDL circuit descriptions each time an HLMS simulation is performed or an IC design is changed within the HLMS is reduced or avoided. The HDL-based simulation programs within the library can be re-compiled only if the HDL circuit descriptions are changed. Additionally, the program code of the HDL-based simulation programs within the library may be performance enhanced towards a target HLMS.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. In an integrated circuit modeling system, a method of simulating an integrated circuit design using one or more circuit description language representations of circuitry, the method comprising:

translating a circuit description language representation of the one or more circuit description language representations of circuitry into a program language circuit description, the circuit description language representation being in a hardware description language;

executing a first part of a simulation in a high-level modeling system ("HLMS") portion of the integrated circuit modeling system, the first part of the simulation being executed using one or more first HLMS simulation programs to produce first simulation results, the one or more first HLMS simulation programs being in program language;

obtaining the first simulation results for input data from the first part of the simulation;

executing a second part of the simulation with the input data as parametric input to produce output data as second simulation results, the second part of the simulation including providing the input data to the program language circuit description for the second part of the simulation to produce the second simulation results; and providing the second simulation results as input to one or more second HLMS simulation programs for further simulation in the HLMS portion of the integrated circuit modeling system, the one or more second HLMS simulation programs being in program language.

2. The method of claim 1, wherein the first part of the simulation and second part of the simulation are executed as part of a single kernel process.

3. The method of claim 1, wherein the first part of the simulation uses a first process and the second part of the simulation uses a second process.

4. The method of claim 1, further comprising linking the one or more first HLMS simulation programs with the program language circuit description, the linking including at least one type of library selected from a group consisting of a static library and a dynamic library.

5. The method of claim 1, further comprising storing data associated with the second part of the simulation in a database accessible by another part of the simulation.

6. The method of claim 1, further comprising:
providing an interface between the first part of the simulation and the second part of the simulation responsive to the circuit description language representation;
processing the input data with the interface;
providing the input data processed to the second part;
processing the output data with the interface; and
providing the output data processed to a third part of the simulation.

7. The method of claim 6, further comprising storing the interface in a database.

8. The method of claim 1, wherein the translating comprises:
providing a database of pre-defined program language circuit descriptions; and
processing the circuit description language representation into the program language circuit description using one or more pre-defined program language circuit descriptions from the database.

9. The method of claim 8, wherein the program language circuit description is a textual description and the translating further comprises processing the textual description to produce a simulation program.

10. The method of claim 9, wherein the steps of executing comprise interpreting the textual description to produce the simulation program.

11. In an integrated circuit modeling system, a method of simulating an integrated circuit design using one or more hardware description language circuit descriptions, the method comprising:
translating a hardware description language circuit description into a program language circuit description;
executing a first simulation program in a high-level modeling system ("HLMS") portion of the integrated circuit modeling system, the first simulation program being used to produce first simulation results, the first simulation program being in program language;
obtaining the first simulation results for input data from the first simulation program;
producing a second simulation program using the program language circuit description;
executing the second simulation program with the input data as parametric input to produce output data as second simulation results; and
providing the output data to the first simulation program.

12. The method of claim 11 wherein the program language circuit description is in a computer language selected from a group consisting of C, C++, Java, VB/VBA, Python, C#, and an assembly language.

13. The method of claim 11, further comprising storing the second simulation program in a program library accessible by the first simulation program.

14. The method of claim 13, wherein the program library is a dynamic link library capable of being dynamically linked with the first simulation program.

15. The method of claim 11, wherein the translating comprises:
providing a program library of pre-defined program language circuit descriptions using a compiled program language;
compiling the hardware description language circuit description into the program language circuit description using one or more pre-defined program language circuit descriptions from the program library; and
compiling the program language circuit description to produce object code associated with the second simulation program.

16. The method of claim 11, wherein the translating further comprises:
providing a program library of pre-defined program language circuit descriptions using an interpreted program language;
compiling the hardware description language circuit description into the program language circuit description using one or more pre-defined program language circuit descriptions from the program library; and
interpreting the program language circuit description to produce the second simulation program.

17. A computer readable medium having stored thereon instructions that, when executed by a processor, cause the processor to perform a method of simulating an integrated circuit design within an integrated circuit modeling system using one or more circuit description language representations of circuitry, the method comprising:
translating a circuit description language representation of the one or more circuit description language representations of circuitry into a program language circuit description, the circuit description language representation being in a hardware description language;
executing a first part of a simulation process in a high-level modeling system ("HLMS") portion of the integrated circuit modeling system, the first part of the simulation being executed using one or more first HLMS simulation programs to produce first simulation results, the one or more first HLMS simulation programs being in program language;
obtaining the first simulation results for input data from the first part of the simulation process;
executing a second part of a simulation process with the input data as parametric input to produce output data as second simulation results, the second part of the simulation process being derived from the program language circuit description; and
providing the output data to one or more second HLMS simulation programs as input thereto for further simulation in the HLMS portion of the integrated circuit modeling system, the one or more second HLMS simulation programs being in program language.

18. In an integrated circuit modeling system, an apparatus for simulating an integrated circuit design using one or more circuit description language representations of circuitry, the apparatus comprising:
means for translating a circuit description language representation of the one or more circuit description language representations of circuitry into a program language circuit description, the circuit description language representation being in a hardware description language;

means for executing a first portion of a simulation in a high-level modeling system ("HLMS") portion of the integrated circuit modeling system, the first portion of the simulation being executed using one or more first HLMS simulation programs to produce first simulation results, the one or more first HLMS simulation programs being in program language;

means for obtaining the first simulation results for input data from the first portion of the simulation;

means for executing a second portion of a simulation with the input data as parametric input to produce output data as second simulation results, the second portion of the simulation being derived from the program language circuit description; and means for providing the output data to one or more second HLMS simulation programs for further simulation in the HLMS portion of the integrated circuit modeling system, the one or more second HLMS simulation programs being in program language.

19. A system for simulating an integrated circuit design using a plurality of circuit description language representations of circuitry, the system comprising:

a processing unit having access to one or more storage devices;

at least a portion of the one or more storage devices having the plurality of circuit description language representations of circuitry and a simulation process related to the integrated circuit design;

at least another portion of the one or more storage devices having a program product configured to:

translate a circuit description language representation of the one or more circuit description language representations of circuitry into a program language circuit description, the circuit description language representation being in a hardware description language;

execute a first series of simulation steps in a high-level modeling system ("HLMS") portion of the simulation process, the first series of simulation steps being executed using one or more first HLMS simulation programs to produce first simulation results, the one or more first HLMS simulation programs being in program language;

obtain input data from the first series;

execute a second series of simulation steps with the input data as parametric input to produce output data, the second series being derived from the program language circuit description; and provide the output data to the first series of simulation steps for further simulation in the HLMS portion of the simulation process.

20. A high level modeling system for simulating an integrated circuit design using one or more circuit description language representations of circuitry, the high level modeling system comprising:

an input section configured to generate input data from a high level modeling system program, the high level modeling system program being in program language;

a translation section for translating a circuit description language representation of the one or more circuit description language representations of circuitry into a program language circuit description, the circuit description language representation being in a hardware description language;

a simulation section configured to execute a simulation process with the input data as parametric input to provide output data, the simulation process being derived from the program language circuit description; and the simulation section coupled to the high level modeling system program for providing the output data thereto for subsequent simulation with the high level modeling system program.

21. The system of claim 20, further comprising:

a first database for storing the one or more circuit description language representations of circuitry; and a second database for storing the program language circuit description.

22. The system of claim 20, further comprising:

an interface section configured as an interface between a first program having the circuit description language representation and a second program having the program language circuit description; and a database for storing the interface.

23. In a high level modeling system (HLMS), comprising a plurality of HLMS components, a method of simulating an integrated circuit design having a hardware description language (HDL) representation of a circuit, the method comprising:

translating the HDL representation into a first HLMS component of the plurality of HLMS components, the plurality of HLMS components being in program language;

executing a first part of a simulation process associated with a second HLMS component of the plurality of HLMS components;

obtaining input data from the first part;

executing a second part of the simulation process with the input data as parametric input to produce output data, the second part associated with the first HLMS component; and providing the output data to the first part of the simulation process for further simulation with a third HLMS component.

\* \* \* \* \*